(12) United States Patent
Govindu et al.

(10) Patent No.: US 7,812,643 B2
(45) Date of Patent: Oct. 12, 2010

(54) IMPLEMENTING CML MULTIPLEXER LOAD BALANCING

(75) Inventors: Shashikala Govindu, Union City, CA (US); Carl Christopher Hanke, III, Morrisville, NC (US); Samuel Taylor Ray, Morgan Hill, CA (US)

(73) Assignee: International Business Machines Corporation, Armonk, NY (US)

( * ) Notice: Subject to any disclaimer, the term of this patent is extended or adjusted under 35 U.S.C. 154(b) by 60 days.

(21) Appl. No.: 12/366,005

(22) Filed: Feb. 5, 2009

(65) Prior Publication Data

US 2010/0194437 A1    Aug. 5, 2010

(51) Int. Cl.
 *H03K 19/20* (2006.01)
 *H03K 19/094* (2006.01)
(52) U.S. Cl. ..................... 326/115; 327/108
(58) Field of Classification Search ............... 326/115, 326/119, 121; 327/108
See application file for complete search history.

(56) References Cited

U.S. PATENT DOCUMENTS

| | | | |
|---|---|---|---|
| 6,239,646 B1* | 5/2001 | Navabi et al. ............... 327/407 |
| 6,433,612 B1* | 8/2002 | Jenkins ....................... 327/408 |
| 2002/0113640 A1* | 8/2002 | Jenkins ....................... 327/408 |
| 2004/0100307 A1* | 5/2004 | Wong et al. .................. 326/115 |
| 2007/0018694 A1* | 1/2007 | Chen et al. ................... 326/115 |
| 2008/0007340 A1* | 1/2008 | Kocaman et al. ............. 330/254 |
| 2009/0252215 A1* | 10/2009 | Bulzacchelli et al. ........ 375/233 |
| 2009/0259781 A1* | 10/2009 | Padaparambil ............... 710/71 |

* cited by examiner

*Primary Examiner*—Vibol Tan
*Assistant Examiner*—Dylan White
(74) *Attorney, Agent, or Firm*—Joan Pennington

(57) ABSTRACT

A method and current mode logic (CML) multiplexer circuit for implementing load balancing, and a design structure on which the subject circuit resides are provided. CML multiplexer circuit includes first and second differential transistor pairs receiving a first differential input signal and a second differential input signal. The respective transistors of the first and second differential transistor pairs are connected to respective differential signal first and second outputs. CML multiplexer circuit includes load balancing third and fourth differential transistor pairs receiving the first differential input signal and the second differential input signal. The respective transistors of the load balancing third and fourth differential transistor pairs are connected to the opposite differential signal outputs as the first and second differential transistor pairs and the select devices are turned off, matching the source impedance of the unselected first or second differential transistor pair.

20 Claims, 4 Drawing Sheets

IMPLEMENTING CML MULTIPLEXER LOAD BALANCING

FIELD OF THE INVENTION

The present invention relates generally to the data processing field, and more particularly, relates to a method and current mode logic (CML) multiplexer circuit for implementing load balancing, and a design structure on which the subject circuit resides.

DESCRIPTION OF THE RELATED ART

Current-mode logic (CML) gates are often utilized due to their superior noise immunity and high frequency performance. For example, CML gates are used in high speed serializer-deserializer (HSS) cores used in application-specific integrated circuits (ASICs) and custom integrated circuits for communication from processor-to-processor and processor-to-input/output devices.

A current mode logic (CML) multiplexer circuit often is used in high speed clock distribution, and also in high speed data paths.

FIG. 1 illustrates a prior art two-to-one (2:1) multiplexer circuit 100 having a compact and area efficient CML multiplexer topology. The prior art 2:1 multiplexer circuit 100 includes a differential signal outputs ZP, ZN provided between a pair of respective resistors 102, 104, and differential transistor pairs 106, 108, and 110, 112. Each of a first input signal pair DOP, DON and a second input signal pair D1P, D1N is applied to respective gate input of the respective transistors 106, 108, 110, 112. A respective select transistor 114, 116 is connected to the differential transistor pairs 106, 108, and 110, 112, and having a respective gate select input SDN, SDP. The select transistors 114, 116 are connected together to bias footer transistor 118 having a gate input VB.

A problem with the prior art 2:1 multiplexer circuit 100 is parasitic capacitance load imbalance. When the second data signal D1P/D1N is actively switching, or in an active CML high or low state, for example, if D1P is high, then ZN will have more parasitic capacitance through transistor 110 because this device is turned on. Output ZP sees only the parasitic drain capacitance of transistor 112, which is turned off. If D1P is low, the opposite is true; ZP will see more parasitic capacitance than ZN. The parasitic capacitance load imbalance causes both duty cycle distortion and jitter due to the persistent ZP/ZN load imbalance.

FIG. 2 illustrates a prior art two-to-one (2:1) multiplexer circuit 200 including a prior art passgate arrangement for load balancing. Each of a first input signal pair DOP, DON and a second input signal pair D1P, D1N is applied to respective gate input of the respective transistors 206, 208, 210, 212 by a respective passgate transistors 220, 224; 226, 228; 230, 234; and 236, 238 controlled by respective select input signals SDP and SDN. The select input signal SDP is applied to the gate input of transistor 224, 228, and the select input signals SDN is applied to the gate input of transistor 234, 238.

In the passgate load balancing multiplexer circuit 200 of FIG. 2, the gates to the non-selected data signals, for example, D1P/D1N are pulled low, and in this situation the ZP/ZN loads are balanced and matched. However, this passgate load balancing multiplexer circuit opens up the issue of driving through transmission gates into the differential pair switching transistors, which is especially problematic when relatively long wires are connecting into these passgates. Also, if not carefully implemented, supply or ground noise can couple through the passgates. These problems become worse with increasing frequency.

A need exists for an effective mechanism for implementing load balancing for current mode logic (CML) multiplexer circuits.

SUMMARY OF THE INVENTION

Principal aspects of the present invention are to provide a method and current mode logic (CML) multiplexer circuit for implementing load balancing, and a design structure on which the subject circuit resides. Other important aspects of the present invention are to provide such method, circuit, and design structure substantially without negative effect and that overcome many of the disadvantages of prior art arrangements.

In brief, a method and current mode logic (CML) multiplexer circuit for implementing load balancing, and a design structure on which the subject circuit resides are provided. CML multiplexer circuit includes first and second differential transistor pairs, each of a first differential input signal and a second differential input signal is applied to a respective gate input of the respective transistors of the first and second differential transistor pairs. The respective transistors of the first and second differential transistor pairs are connected to respective differential signal first and second outputs. A respective select transistor is connected to the first and second differential transistor pairs, each respective select transistor receiving a respective gate select input. CML multiplexer circuit includes load balancing third and fourth differential transistor pairs. Each of the first differential input signal and the second differential input signal is applied to a respective gate input of the respective transistors of the load balancing third and fourth differential transistor pairs. The respective transistors of the load balancing third and fourth differential transistor pairs are connected to opposite differential signal outputs as the first and second differential transistor. Select devices connected to the load balancing third and fourth differential transistor pairs are turned off, substantially matching the source impedance of the unselected first or second differential transistor pair.

In accordance with features of the invention, the load balancing third and fourth differential transistor pairs are arranged so that the parasitic loads seen on the ZP/ZN outputs are always substantially equal. The select devices for the load balancing third and fourth differential transistor pairs are connected to ground, without requiring a gate input of the select input that is applied to the first and second differential transistor pairs.

In accordance with features of the invention, the CML multiplexer circuit provides effective and robust load balancing, minimizing the number of required additional devices.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, a method and multiplexer circuit enable effective load balancing. Multiplexer circuit includes load balancing differential transistor pairs that are arranged so that the parasitic loads seen on the differential signal ZP, ZN outputs are always substantially equal. The load balancing differential transistor pairs are dummy devices connected to the opposite polarity of the active differential transistor pairs.

Figure 3:
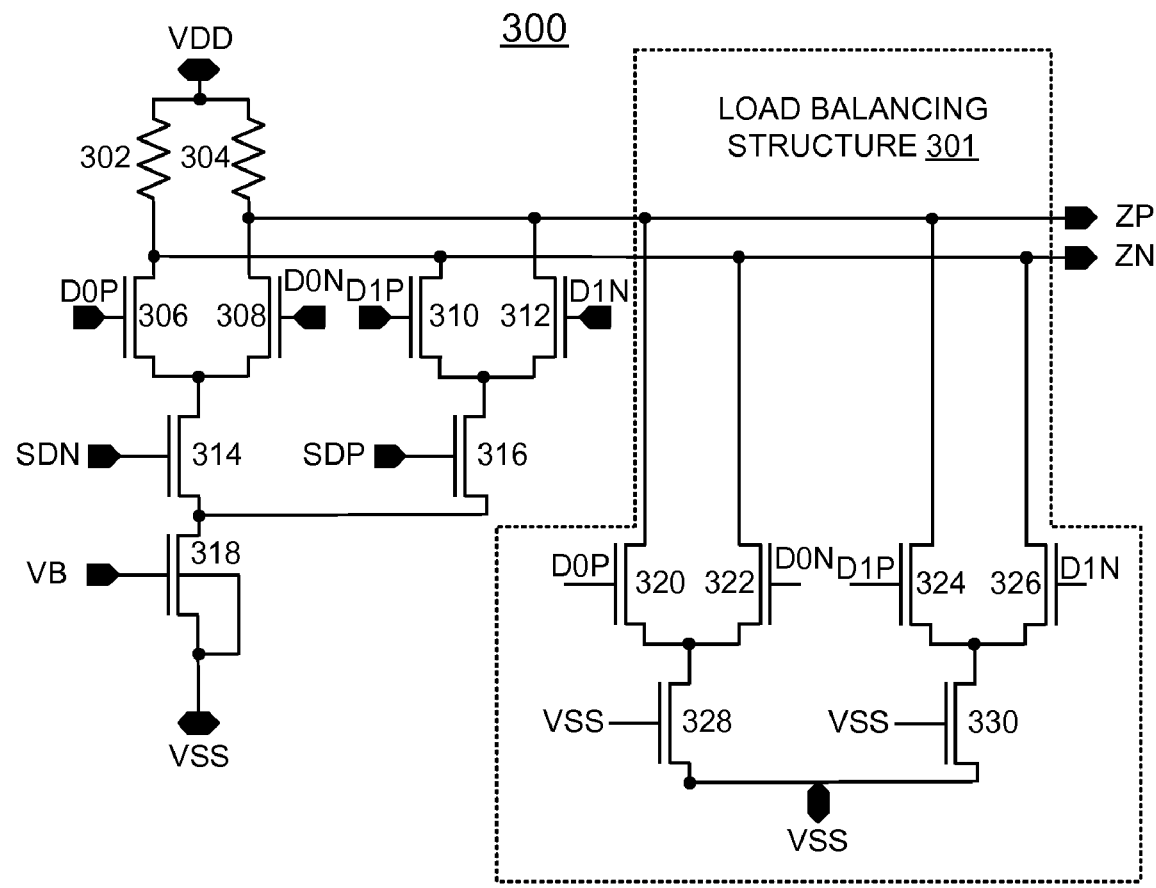
FIG. 3 is a schematic diagram representation of a multiplexer circuit including load balancing in accordance with the preferred embodiment.

Having reference now to the drawings, in FIG. 3, there is shown a multiplexer circuit including load balancing generally designated by the reference character 300 in accordance with the preferred embodiment.

Multiplexer circuit 300 enables effective load balancing, substantially eliminating both duty cycle distortion and jitter of conventional arrangements due to otherwise persistent ZP/ZN load imbalance. Multiplexer circuit 300 is a current mode logic (CML) multiplexer circuit providing superior noise immunity and high frequency performance.

CML multiplexer circuit 300 includes a differential signal first and second outputs ZP, ZN provided between a pair of respective resistors 302, 304, and first and second differential transistor pairs 306, 308, and 310, 312. Each of a first input signal pair DOP, DON and a second input signal pair D1P, D1N is applied to respective gate input of the respective transistors 306, 308, and 310, 312. A respective select transistor 314, 316 is connected to the differential transistor pairs 306, 308, and 310, 312, and receiving a respective gate select input SDN, SDP. The select transistors 314, 316 are connected together to bias footer transistor 318 having a gate input VB.

In accordance with the preferred embodiment, CML multiplexer circuit 300 includes load balancing third and fourth differential transistor pairs 320, 322, and 324, 326. Each of the first differential input signal and the second differential input signal is applied to a respective gate input of the respective transistors 320, 322, 324, 326 of the load balancing third and fourth differential transistor pairs 320, 322, and 324, 326. The respective transistors 320, 322, 324, 326 of the load balancing third and fourth differential transistor pairs 320, 322, and 324, 326 are connected to opposite differential signal second and first outputs ZP, ZN as the first and second differential transistor pairs, connected to ZN, ZP.

In accordance with the preferred embodiment, CML multiplexer circuit 300 includes load balancing select devices 328, 330. The select devices 328, 330 include grounded gate inputs and are turned off. The third and fourth differential transistor pairs 320, 322, and 324, 326 are effective for matching the source impedance of the unselected first or second differential signal pair.

Select devices for the load balancing third and fourth differential transistor pairs are turned off, substantially matching the source impedance of the unselected first differential signal pair 306, 308 or second differential signal pair 310, 312.

CML multiplexer circuit 300 preferably is formed of N-channel field effect transistors (FETs). The first and second differential transistor pairs 306, 308, and 310, 312, are actively switching devices similar to the prior art CML multiplexer 100. CML multiplexer circuit 300 minimizes the number of required additional devices. CML multiplexer circuit 300 provides effective and robust load balancing, including only six additional load balancing transistors 320, 322, 324, 326, 328, 330. CML multiplexer circuit 300 is applicable for high frequencies, for example, 4-5 GHz in CMOS10SF technology.

Figure 1:
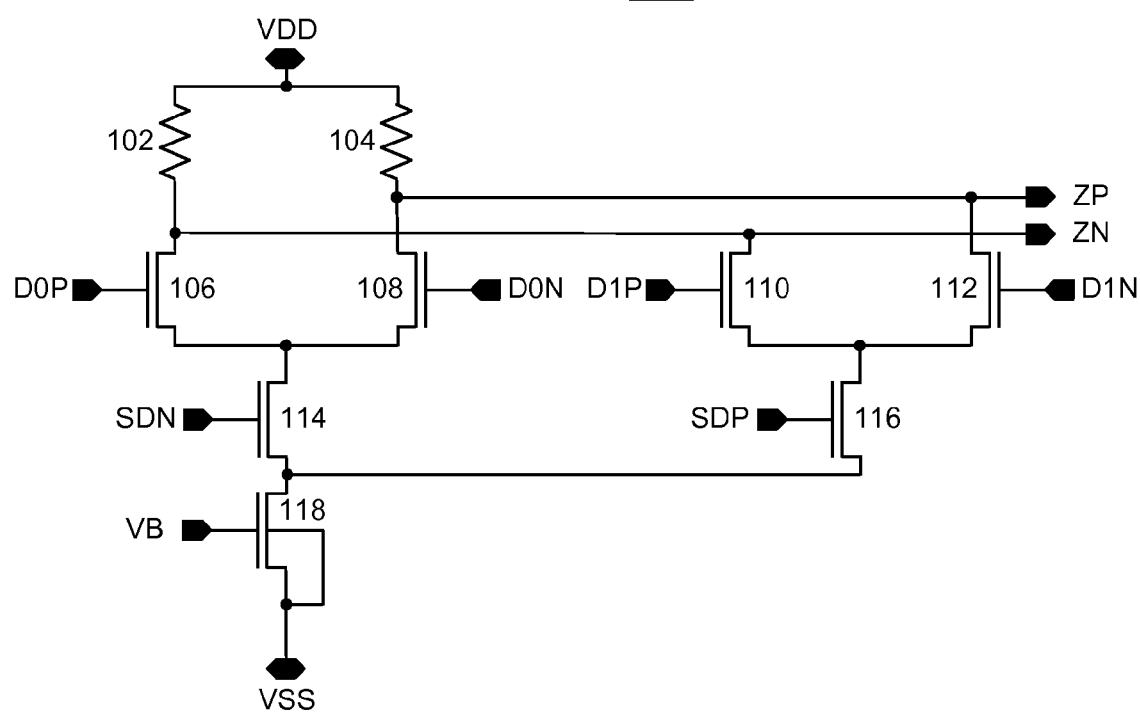
FIG. 1 illustrates a prior art two-to-one (2:1) multiplexer circuit having a compact and area efficient CML multiplexer topology.
Figure 2:
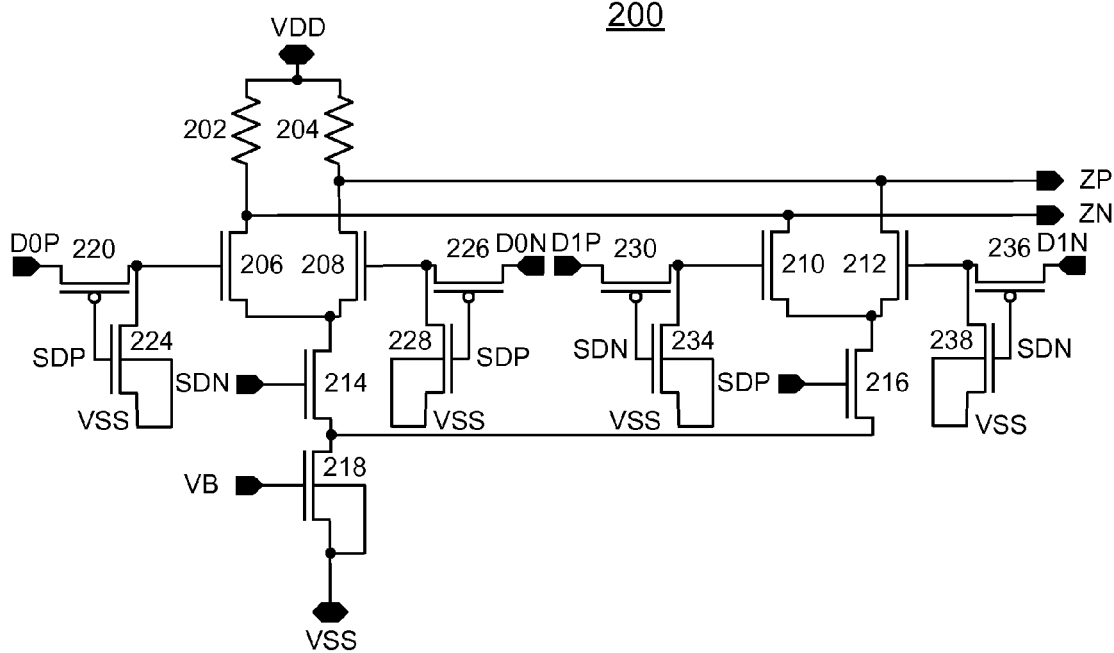
FIG. 2 illustrates a prior art two-to-one (2:1) multiplexer circuit including a passgate arrangement for load balancing.

CML multiplexer circuit 300 effectively avoids issues of the prior art multiplexer circuit 200 of FIG. 2 including possible supply or ground noise coupling through the passgates; and driving through transmission gates into the switching differential transistor pairs, which is especially problematic with increasing frequency and also when relatively long wires are connected into the pass-gates.

A series of simulations have been run, which show that the conventional multiplexer 100 has up to 1.2 ns of load imbalance induced jitter. Under the same simulation and input conditions, the CML multiplexer circuit 300 yields 15 ps, a very significant improvement. It should be noted that these simulations were at a single process corner, without device mismatch, and without a supply noise source, that is a quiet/ideal supply. Clock/data frequencies in the set of simulations were 400 MHz for the selected clock, and 800 MHz (jitter is the cumulative value over 200 ns) for the non-selected clock, nominal process, VDD=1V, T=70C.

Figure 4:
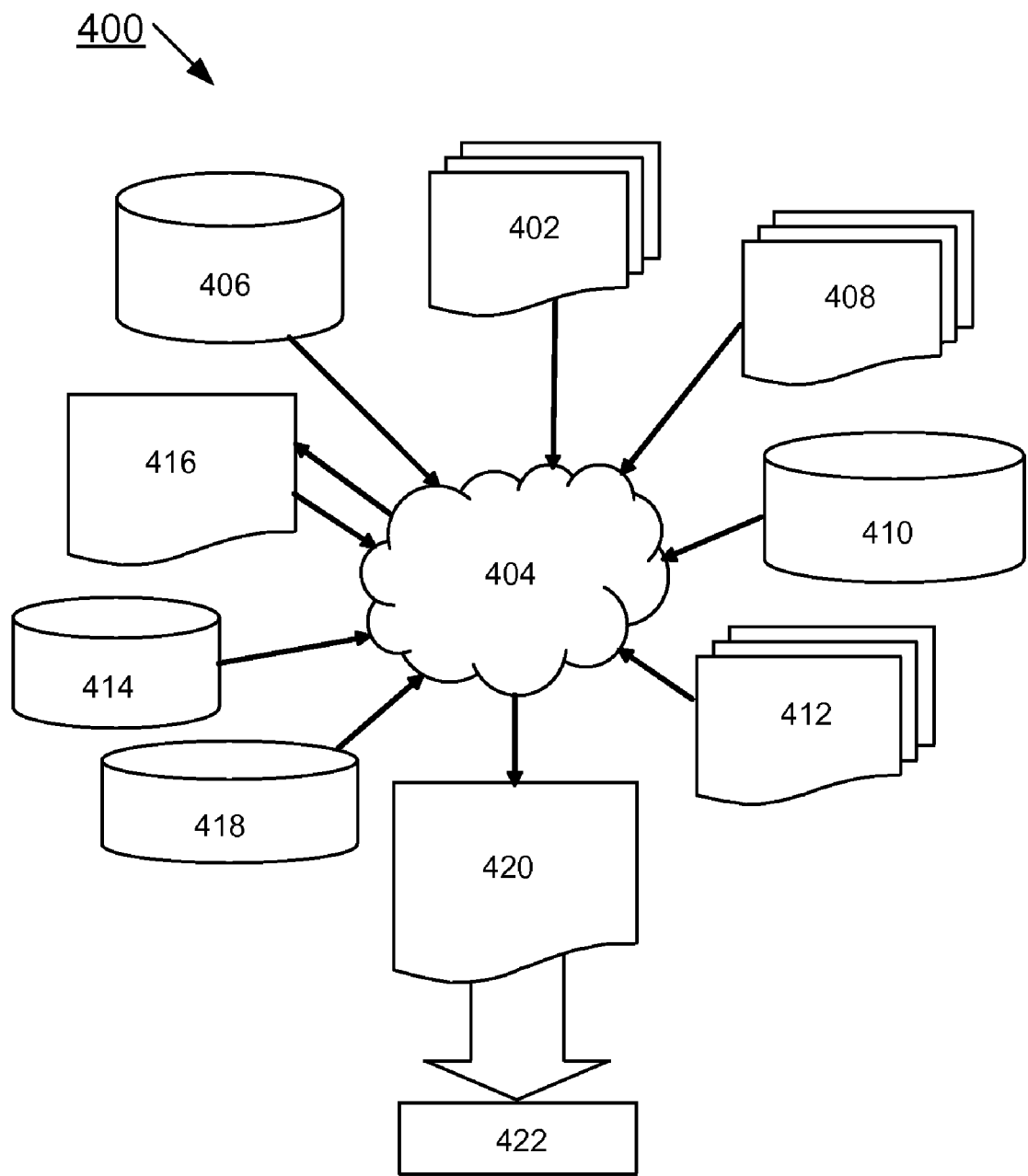
FIG. 4 is a flow diagram of a design process used in semiconductor design, manufacturing, and/or test.

FIG. 4 shows a block diagram of an example design flow 400. Design flow 400 may vary depending on the type of IC being designed. For example, a design flow 400 for building an application specific IC (ASIC) may differ from a design flow 400 for designing a standard component. Design structure 402 is preferably an input to a design process 404 and may come from an IP provider, a core developer, or other design company or may be generated by the operator of the design flow, or from other sources. Design structure 402 comprises circuit 300 in the form of schematics or HDL, a hardware-description language, for example, Verilog, VHDL, C, and the like. Design structure 402 is tangibly contained on, for example, one or more machine readable medium.

For example, design structure 402 may be a text file or a graphical representation of circuit 300. Design process 404 preferably synthesizes, or translates, circuit 300 into a netlist 406, where netlist 406 is, for example, a list of wires, transistors, logic gates, control circuits, I/O, models, etc. that describes the connections to other elements and circuits in an integrated circuit design and recorded on at least one of machine readable medium. This may be an iterative process in which netlist 406 is resynthesized one or more times depending on design specifications and parameters for the circuit.

Design process 404 may include using a variety of inputs; for example, inputs from library elements 408 which may house a set of commonly used elements, circuits, and devices, including models, layouts, and symbolic representations, for a given manufacturing technology, such as different technology nodes, 32 nm, 45 nm, 90 nm, and the like, design specifications 410, characterization data 412, verification data 414, design rules 416, and test data files 418, which may include test patterns and other testing information.

Design process 404 may further include, for example, standard circuit design processes such as timing analysis, verification, design rule checking, place and route operations, and the like. One of ordinary skill in the art of integrated circuit design can appreciate the extent of possible electronic design automation tools and applications used in design process 404 without deviating from the scope and spirit of the invention. The design structure of the invention is not limited to any specific design flow.

Design process 404 preferably translates an embodiment of the invention as shown in FIG. 3 along with any additional integrated circuit design or data (if applicable), into a second design structure 420. Design structure 420 resides on a storage medium in a data format used for the exchange of layout data of integrated circuits, for example, information stored in a GDSII (GDS2), GL1, OASIS, or any other suitable format for storing such design structures. Design structure 420 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIG. 3. Design structure 420 may then proceed to a stage 422 where, for example, design structure 420 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A current mode logic (CML) multiplexer circuit for implementing load balancing comprising:
   first and second differential transistor pairs; said respective transistors of said first and second differential transistor pairs being connected to respective differential signal first and second outputs;
   a first differential input signal being applied to a respective gate input of respective transistors of said first differential transistor pair;
   a second differential input signal being applied to a respective gate input of said second differential transistor pair;
   a respective select transistor being connected to said first and second differential transistor pairs, each respective select transistor receiving a respective gate select input;
   load balancing third and fourth differential transistor pairs; said first differential input signal and said second differential input signal being applied to a respective gate input of respective transistors of said load balancing third and fourth differential transistor pairs; said respective transistors of said load balancing third and fourth differential transistor pairs being connected to opposite differential signal first and second outputs as said first and second differential transistor pairs; and
   a respective load balancing select transistor being connected to said load balancing third and fourth differential transistor pairs; said select devices being turned off, and said load balancing third and fourth differential transistor pairs substantially matching a source impedance of an unselected one of said first and second differential transistor pair.

2. The CML multiplexer circuit as recited in claim 1, wherein said load balancing third and fourth differential transistor pairs are connected to enable substantially equal parasitic loads on said differential signal first and second outputs.

3. The CML multiplexer circuit as recited in claim 1, wherein said load balancing select devices have a gate input connected to ground.

4. The CML multiplexer circuit as recited in claim 1, wherein said first and second differential transistor pairs, and said load balancing third and fourth differential transistor pairs are formed of field effect transistors.

5. The CML multiplexer circuit as recited in claim 1, wherein said load balancing third and fourth differential transistor pairs and said load balancing select transistors include six field effect transistors.

6. The CML multiplexer circuit as recited in claim 1, includes a pair of resistors connected between a voltage supply rail and said respective differential signal first and second outputs.

7. The CML multiplexer circuit as recited in claim 1, wherein each of said respective load balancing select transistor connected to said load balancing third and fourth differential transistor pairs is connected to ground potential.

8. The CML multiplexer circuit as recited in claim 1, wherein said first and second differential transistor pairs, said load balancing third and fourth differential transistor pairs, and said select transistors are formed of N-channel field effect transistors (NFETs).

9. A method for implementing load balancing of a current mode logic (CML) multiplexer circuit, said CML multiplexer circuit including first and second differential transistor pairs; said respective transistors of said first and second differential transistor pairs being connected to respective differential signal first and second outputs; a first differential input signal being applied to a respective gate input of respective transistors of said first differential transistor pair; a second differential input signal being applied to a respective gate input of said second differential transistor pair; a respective select transistor being connected to said first and second differential transistor pairs, each respective select transistor receiving a respective gate select input, said method comprising the steps:
   connecting load balancing third and fourth differential transistor pairs to opposite differential signal first and second outputs as said first and second differential transistor pairs;
   applying said first differential input signal and said second differential input signal to a respective gate input of respective transistors of said load balancing third and fourth differential transistor pairs; and
   connecting a respective load balancing select transistor to said load balancing third and fourth differential transistor pairs; said select devices being turned off, and said load balancing third and fourth differential transistor pairs substantially matching a source impedance of an unselected one of said first and second differential transistor pair.

10. The method for implementing load balancing of the CML multiplexer circuit as recited in claim 9, includes connecting a gate input of said load balancing select devices for the load balancing third and fourth differential transistor pairs to ground.

11. The method for implementing load balancing of the CML multiplexer circuit as recited in claim 9, includes providing a pair of resistors connected between a voltage supply rail and said respective differential signal first and second outputs.

12. The method for implementing load balancing of the CML multiplexer circuit as recited in claim 9, includes providing N-channel field effect transistors (NFETs) for said first and second differential transistor pairs, said load balancing third and fourth differential transistor pairs, and each of said select transistors.

13. The method for implementing load balancing of the CML multiplexer circuit as recited in claim 9, includes providing six field effect transistors for implementing said load balancing third and fourth differential transistor pairs and said load balancing select transistors.

14. A design structure tangibly embodied in a machine readable medium used in a design process, the design structure comprising:

a current mode logic (CML) multiplexer circuit tangibly embodied in the machine readable medium used in the design process, said CML multiplexer circuit for implementing load balancing comprising:

first and second differential transistor pairs; said respective transistors of said first and second differential transistor pairs being connected to respective differential signal first and second outputs;

a first differential input signal being applied to a respective gate input of respective transistors of said first differential transistor pair;

a second differential input signal being applied to a respective gate input of said second differential transistor pair;

a respective select transistor being connected to said first and second differential transistor pairs, each respective select transistor receiving a respective gate select input;

load balancing third and fourth differential transistor pairs; said first differential input signal and said second differential input signal being applied to a respective gate input of respective transistors of said load balancing third and fourth differential transistor pairs; said respective transistors of said load balancing third and fourth differential transistor pairs being connected to opposite differential signal first and second outputs as said first and second differential transistor pairs; and a respective load balancing select transistor being connected to said load balancing third and fourth differential transistor pairs; said select devices being turned off, and said load balancing third and fourth differential transistor pairs substantially matching a source impedance of an unselected one of said first and second differential transistor pair, wherein the design structure, when read and used in the manufacture of a semiconductor chip produces a chip comprising said CML multiplexer circuit.

15. The design structure of claim 14, wherein the design structure comprises a netlist, which describes said CML multiplexer circuit.

16. The design structure of claim 14, wherein the design structure resides on storage medium as a data format used for the exchange of layout data of integrated circuits.

17. The design structure of claim 14, wherein the design structure includes at least one of test data files, characterization data, verification data, or design specifications.

18. The design structure of claim 14, wherein said CML multiplexer circuit includes a pair of resistors connected between a voltage supply rail and said respective differential signal first and second outputs.

19. The design structure of claim 14, wherein said CML multiplexer circuit includes said load balancing select transistor having a gate input connected to ground potential.

20. The design structure of claim 14, wherein said load balancing third and fourth differential transistor pairs and said load balancing select transistors include six field effect transistors.

* * * * *